United States Patent [19]

Okano

[11] Patent Number: 4,734,630

[45] Date of Patent: Mar. 29, 1988

[54] METHOD AND APPARATUS FOR PHASE COMPARISON ADAPTED TO PRODUCE AN ERROR SIGNAL AGAINST AN INPUT SIGNAL HAVING A RELATIVELY WIDE RANGE OF PHASE AND FREQUENCY VARIATION

[75] Inventor: Takashi Okano, Tokorozawa, Japan

[73] Assignee: Pioneer Electronic Corporation, Tokyo, Japan

[21] Appl. No.: 22,514

[22] Filed: Mar. 9, 1987

Related U.S. Application Data

[63] Continuation-in-part of Ser. No. 839,587, Mar. 14, 1986, abandoned.

[30] Foreign Application Priority Data

Mar. 16, 1985 [JP] Japan .................................. 60-52855

[51] Int. Cl.[4] ............................................ H02P 7/00
[52] U.S. Cl. ..................................... 318/608; 318/314; 318/341; 318/636; 318/599; 307/511
[58] Field of Search ............... 318/314, 608, 341, 606, 318/636, 599; 307/511

[56] References Cited

U.S. PATENT DOCUMENTS

| | | | |
|---|---|---|---|
| 3,487,458 | 12/1969 | Martens et al. | 318/606 X |
| 4,378,519 | 3/1983 | Du Vall | 318/608 |
| 4,511,830 | 4/1985 | Yamada | 318/663 X |
| 4,562,394 | 12/1985 | Itoh | 318/608 |
| 4,572,995 | 2/1986 | Enami | 318/606 X |
| 4,613,799 | 9/1986 | Sumi | 318/318 |

*Primary Examiner*—Benjamin Dobeck
*Attorney, Agent, or Firm*—Fleit, Jacobson, Cohn & Price

[57] ABSTRACT

Method and system for phase comparison which uses a ramp-form signal generated from a reference frequency signal and a sampling pulse train signal synchronized with an input signal whose phase change is to be detected. The reference frequency signal, through a dividing circuit is normally utilized for generating the ramp-form signal while a shift pulse signal is generated when a phase of the sampling pulse train signal is deviated outside a predetermined section of each ramp portion of the ramp-form signal, and utilized for generating the ramp-form signal. By this feature, sampling times of the ramp-form signal are always maintained within the predetermined section of each ramp portion of the ramp-form signal even if a frequency of the input signal deviates very widely from the frequency of the reference frequency signal.

22 Claims, 23 Drawing Figures

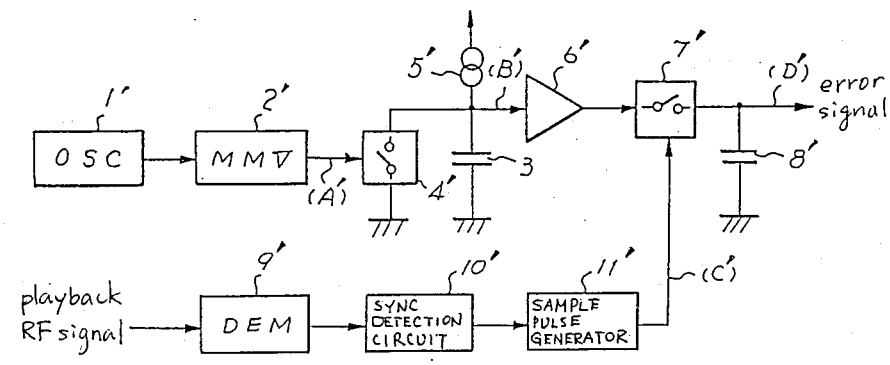
Fig. 1 (PRIOR ART)
Fig. 2A (PRIOR ART)
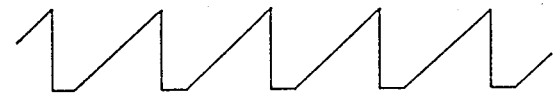
Fig. 2B (PRIOR ART)
Fig. 2C (PRIOR ART)
Fig. 2D (PRIOR ART)
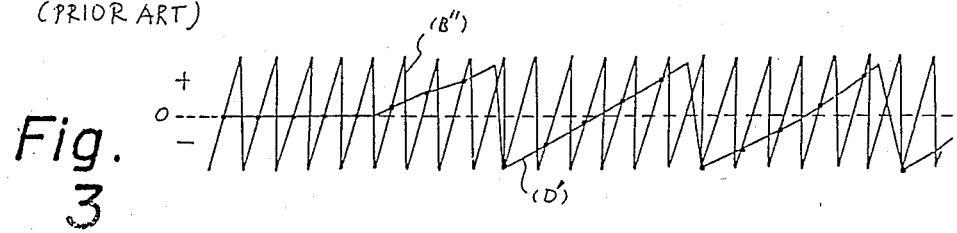
Fig. 3 (PRIOR ART)

METHOD AND APPARATUS FOR PHASE COMPARISON ADAPTED TO PRODUCE AN ERROR SIGNAL AGAINST AN INPUT SIGNAL HAVING A RELATIVELY WIDE RANGE OF PHASE AND FREQUENCY VARIATION

This application is a continuation, of application Ser. No. 839,587, filed Mar. 17, 1986 now abandoned.

BACKGROUND OF THE INVENTION

1. Field of the Invention

The present invention relates to phase comparing method and apparatus, and more specifically to phase comparing method and apparatus for use in a servo control system of a mechanism including a rotating part, such as a spindle motor, for maintaining the speed and the phase of the rotation of the rotating part constant.

2. Description of Background Information

A phase comparator is generally used in control systems of mechanisms having a rotating part for generating a drive speed control signal. In such control systems, the control signal is generated in response to a phase difference between a frequency signal which is in synchronism with the rotation of the rotating part, such as a playback sync signal recovered from a recording disc, and a reference signal generated by a source of reference signal.

An example of conventional phase comparing circuitry being used in a disc player for controlling a disc drive speed is shown in FIG. 1.

As shown, a reference oscillation signal from a reference signal generator 1' is supplied to an MMV (monostable multivibrator) 2' where the input signal is converted to a pulse train signal (A') consisting of pulses having a constant pulse width. A capacitor 3' having a terminal connected to a current source 5' is provided and charge and discharge of this capacitor 3' is controlled by opening and closing of a switch 4' which is connected to the terminal of the capacitor 3'. The opening and closing of the switch 4' is controlled by means of the pulse train signal supplied from the MMV 2'. Specifically, the capacitor 3' is charged when the switch 4' is turned off (opened) so that a voltage (B') for sampling, i.e. a ramp-form, or sawtooth, signal appears at the terminal of the capacitor 3'. The ramp-form signal is supplied to a sample switch 7' through a buffer amplifier 6' which has a voltage shifting function for setting a center voltage of the ramp-form signal at zero level.

A sampled output signal produced from the sample switch 7' is held by means of a holding capacitor 8' and a signal (D') held by the holding capacitor 8' is used as the phase error signal.

On the other hand, an RF signal whose phase error is to be detected, such as a playback video signal, is demodulated at a demodulator 9' and in turn supplied to a sync (synchronization) detection circuit 10' in which a playback sync signal is extracted from a demodulation signal from the demodulator 9'. A sample pulse generator 11' is connected to the sync detection circuit 10' so as to produce a sampling pulse train signal (C') made up of a plurality of sampling pulses, in synchronism with the playback sync signal.

With reference to waveform diagrams of FIGS. 2A through 2D which respectively show waveforms of the signals (A') through (D'), the operation of the phase comparator circuitry shown in FIG. 1 will be explained.

When a phase change of the playback signal occurs, the phase of the sampling pulse signal changes accordingly. Therefore, sampling timing of the ramp-form signal which is produced at the terminal of the capacitor 3' and supplied to the sampling switch 7' is varied in response to the phase change in the playback sync signal. The level of the phase error signal developed at the terminal of the holding capacitor 8' is varied in this way.

With this type of arrangement, a proper phase error signal can be produced so far as the frequency of the playback sync signal is near to the frequency of the reference signal. However, if the frequency difference between the playback sync signal and the reference signal becomes large, the generation of proper phase error signal becomes no more possible because of the reason which is described in detail below.

When, for example, the frequency of the playback signal drops significantly, the interval of the sampling pulses increases accordingly. Therefore, as shown in FIG. 3, the level of the error signal (D') increases, from a zero level, towards a peak level appearing at a top portion of each slope of the ramp-form signal (B") which appears at an output terminal of the buffer amplifier 6 and shown in this figure for the explanation purpose. At the peak of the rise, the phase error signal reverses the direction and decreases immediately towards a negative side as a result of the sampling of the ramp-form signal at its portions of the lowest level. Then, the error signal increases with time towards the peak level and this type of change occurs repeatedly. In this way, the phase error signal oscillates between the peak level and the lowest level of the ramp-form signal like a saw tooth wave, as typically illustrated at the line (D') in FIG. 3. The frequency of the above explained oscillation of the phase error signal increases as the frequency difference between the playback signal and the reference signal becomes large.

If the phase error signal under the oscillating state as explained above is utilized for controlling the drive of the rotating part such as a spindle motor for supporting a disc in a disc playing system, it becomes very difficult to perform a proper control operation, especially, lock-in or synchronization of a servo system which is generally provided in the disc playing system becomes difficult.

Because of the reason stated above, it is general to provide, in addition to the phase error detection circuit 20 such as the circuit shown in FIG. 1, a frequency difference detector 30 and an adder circuit 31 for adding the phase error signal from the phase error detection circuit and an output signal of the frequency difference detector, as illustrated in FIG. 4.

By adding the frequency difference detector 30, it becomes possible to control the rotary mechanism within a speed range permitting a pull-in of the servo system by means of the output signal of the frequency difference detector, because an average of the level of the output signal of the phase error detection circuit under the oscillating state is substantially equal to zero. When a difference between the speed of the rotary mechanism and a target speed has decreased sufficiently, the servo control of the driving by means of the output signal of the phase error detection circuit is started.

However, in the case of this type of measure, it is disadvantageous that two detection systems which are independent from each other are required and an interaction between off-set levels of the detection systems is difficult to avoid, and complicated adjusting operations are required for ensuring an accurate and smooth operation of the servo system.

OBJECTS AND SUMMARY OF THE INVENTION

An object of the present invention is therefore to provide method and apparatus for comparing phase by which an accurate phase error signal can be always produced in a relatively simple manner, and in which a frequency detection operation is also enabled.

According to the present invention, the phase comparing method is generally constructed to sample levels of the ramp-form signal in accordance with sample pulses which are synchronized with a predetermined signal whose phase error is to be detected, and a hold output signal of sampled signals is derived as a phase error signal. The method comprises, more precisely, a step for generating a ramp-form signal, a step for generating a reference signal having a predetermined frequency, a dividing step for dividing the reference signal, a step for detecting a condition that the phase of the sampling pulse signal goes outside a predetermined range of the ramp-form signal, a step for generating a shift pulse having a predetermined pulse width in response to the detection of the condition, and a gating step for stopping the supply of the reference signal for said dividing step during the presence of the shift pulse signal, whereby generating the ramp-form signal in response to an output pulse signal from the dividing step.

According to another aspect of the present invention, a phase comparing apparatus has a general construction to sample levels of the ramp-form signal in accordance with sample pulses which are synchronized with a predetermined signal whose phase error is to be detected, and a hold output signal of sampled signals is derived as a phase error signal. The apparatus comprises, more precisely, means for generating a ramp-form signal, a reference oscillator for generating a reference signal having a predetermined frequency, dividing means for dividing the reference signal, means for detecting a condition that the phase of the sampling pulse signal goes outside a predetermined range of the ramp-form signal, means for generating a shift pulse having a predetermined pulse width in response to the detection of the condition, and a gate means for stopping the supply of the reference signal to said dividing means during the presence of the shift pulse signal, whereby generating the ramp-form signal in response to an output pulse signal from the dividing means.

BRIEF DESCRIPTION OF THE DRAWINGS

FIG. 1 is a block diagram showing an example of conventional phase comparator circuitry;

FIGS. 2A through 2D are waveform diagrams showing waveforms of signals (A') through (D') appearing in the circuitry of FIG. 1;

FIG. 3 is a diagram showing a waveform of a phase error signal obtained by the phase comparator circuitry shown in FIG. 1, especially showing an waveform appearing when the speed of rotation of the rotational part becomes lower than the reference speed;

DETAILED DESCRIPTION OF A PREFERRED EMBODIMENT

Figure 5:
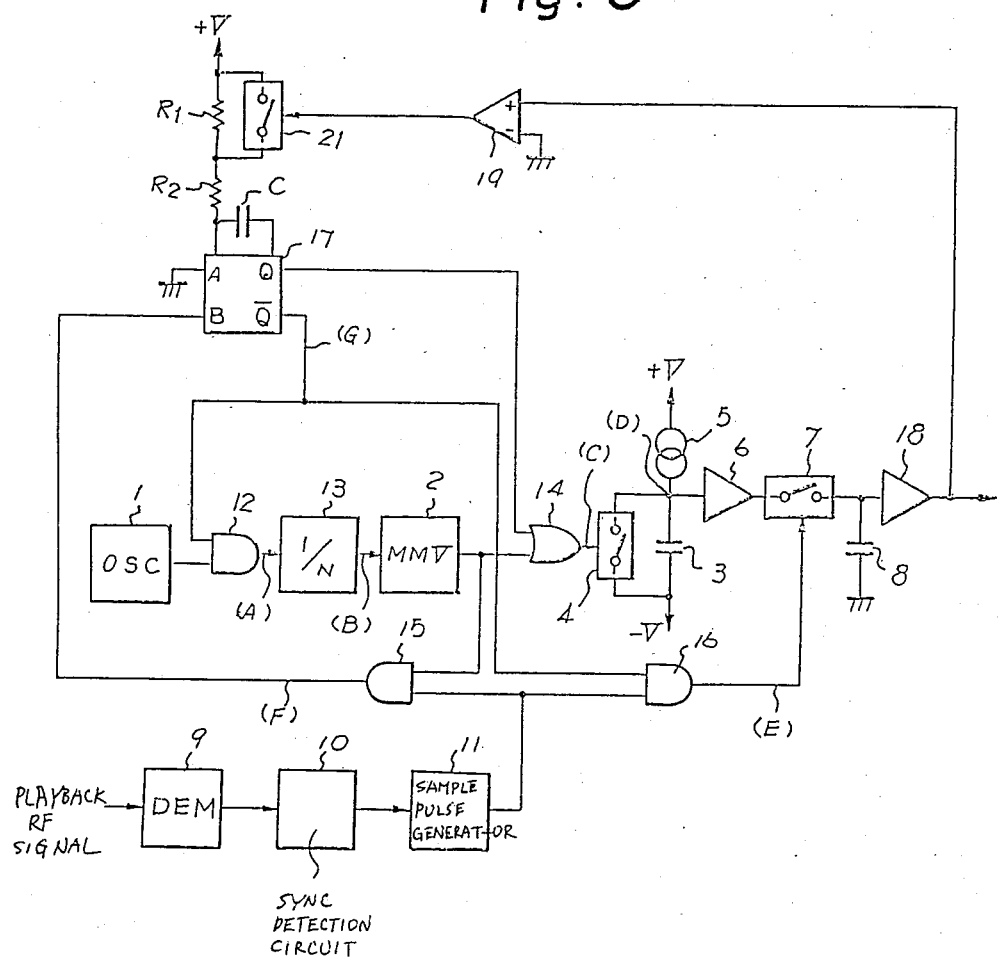
FIG. 5 is a block diagram showing the construction of an embodiment of the phase comparing apparatus according to the present invention.

Referring to FIG. 5, an embodiment of the method and apparatus for detecting phase error according to the present invention will be described hereinafter.

As shown in the blockdiagram of FIG. 5, the apparatus includes a reference signal oscillator 1 which is for example made up of a crystal oscillator. The frequency of the reference signal is selected at a frequency N times the frequency of the horizontal synchronizing signal. The reference signal is supplied to one of input terminals of a two input AND gate circuit 12. The reference signal after passing through the AND gate circuit 12 is supplied to a counter 13 in which the input signal is divided by N, to provide a pulse signal (B) having the frequency fH of the horizontal sync signal, which signal (B) is in turn supplied to an MMV (monostable multivibrator) 2. An output signal of the MMV 2 is supplied to one of the input terminals of a two input OR gate circuit 14 whose output signal is used for controlling a switch 4 which is provided across terminals of a charge-discharge capacitor 3. A constant current source 5, to which a positive voltage is supplied, is connected to one of the terminals of the capacitor 3. The other one of the terminals of the capacitor 3 is connected to a negative voltage source.

A voltage appearing at the terminal of the capacitor 3 at which the constant current source 5 is connected is supplied to a switch 7 for sampling via a buffer amplifier 6.

On the other hand, an RF signal whose phase error is to be detected, such as a playback video signal, is demodulated at a demodulator 9 and in turn supplied to a sync (syncronization) detection circuit 10 in which a playback sync signal is extracted from a demodulation signal from the demodulator 9. A sample pulse generator 11 is connected to the sync detection circuit 10 so as to produce a sampling pulse train signal made up of a plurality of sampling pulses, in synchronism with the playback sync signal.

The sampling pulse signal from the sampling pulse generating circuit 11 is supplied to one of input terminals of two input AND gates 15 and 16 respectively. To the other input terminal of the AND gate 15, the output signal of the MMV 2 is also supplied. An output signal (F) of the AND gate 15 is used as a trigger input signal of an MMV 17. The MMV 17 is triggerred by a leading edge of the output signal of the MMV 15 and its Q output signal is supplied to the other input terminal of the OR gate circuit 14. The $\overline{Q}$ output signal (G) of the MMV 17 is supplied to the other input terminals of the AND gates 12 and 16. The output signal (E) of the AND gate 16 is supplied to the sample switch 7 as its control signal.

The ramp-form signal (D) which is generated at a terminal of the capacitor 3 is supplied to the sample switch 7 via the buffer amplifier 6, and a sampled signal obtained by the sampling switch 7 is held by means of a hold capacitor 8. The thus obtained hold signal is provided as a phase error signal through a buffer circuit 18. The phase error signal is supplied to an input terminal of a comparator 19 and an output signal, that is, a comparison signal is supplied to a switch 21 as its control signal. The switch 21 is connected to the MMV 17 as an external element and coupled with a resistor R in a time constant circuit made up of resistors $R_1$ and $R_2$ and a capacitor C which controls the pulse width of the output pulse signal of the MMV 17.

Referring to the timing charts of FIGS. 6A–6G and FIGS. 7A–7G, the operation of the phase comparing circuitry according to the present invention will be explained hereinafter. FIGS. 6A–6G and FIGS. 7A–7G respectively show the waveform of the signals (A) through (G) shown in FIG. 5.

FIGS. 6A through 6G show the waveforms in a case where the speed of rotation of the disc is higher than a synchronized speed of rotation.

Figure 6A:
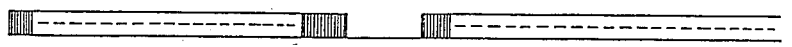
FIGS. 6A through 6G are timing charts showing timing of signals (A) through (G) appearing at various points of the circuitry, observed when the rotatinal speed of the disc is lower than a synchronized speed.
Figure 6B:
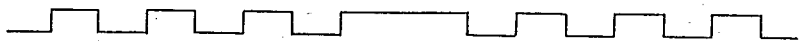
Figure 6C:
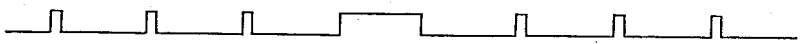
Figure 6D:
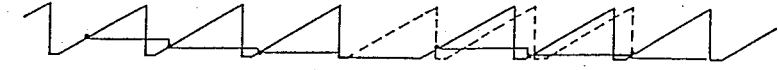
Figure 6E:
Figure 6F:
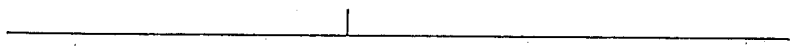
Figure 6G:
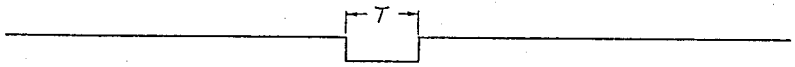
Figure 7A:
FIGS. 7A through 7G are timing charts showing waveforms of signals (A)· through (G) appearing at various points of the circuitry, observed when the rotatinal speed of the disc is higher than the synchronized speed; and, FIG. 8 is a diagram showing waveform of a phase error singal obtained by the phase comparing apparatus according to the present invention and shown in FIG. 5, under various condition.
Figure 7B:
Figure 7C:
Figure 7D:
Figure 7E:
Figure 7F:
Figure 7G:
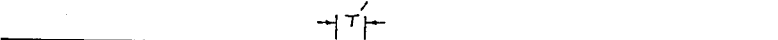

In this case, the interval of each pulses of the sample pulse signal is shorter than the period of the ramp-form signal. Therefore as shown in FIG. 6D, the point of sampling goes down toward the negative side along the slope of the ramp-form signal. In this state, the level of the phase error signal decreases in the negative direction beyond the zero level. Under this condition, since the output signal of the comparator 19 has a low level, the switch 21 is left open.

When the sampling point has reached the lowest part of the slope of the ramp-form signal, the generation of the sampling pulse signal occurs during a time period in which the output pulse signal of the MMV 2 is present. Therefore, both of the two input terminals of the AND gate 15 receive a high level input signal. Therefore, an output signal (F) of the AND gate 15 is generated and the MMV 17 is triggerred by a leading edge of the output signal (F). The pulse width T of the Q output signal and $\overline{Q}$ output signal (G) of the MMV 17, determined by $(R_1+R_2) \cdot C \times K$, is set slightly shorter than one horizontal scanning period To (63.556µ sec in the NTSC system and 64.0µ sec in the PAL system.)

By the generation of the $\overline{Q}$ output signal (G) of the MMV 17, the supply of the reference signal from the reference signal oscillator 1 to the counter 12 is stopped by an operation of the AND gate 12. Therefore, the count operation of the dividing counter 13 is suspended during this period. The state is not the resetting but the holding of the operation of the counter 13. Therefore, the output signal of the counter 13 is delayed by a period equal to the pulse width T of the $\overline{Q}$ output signal (G) of the MMV 17. At the same time, the Q output signal of the MMV 17 is supplied to the switch 4 through the OR gate 14. As a result, the ramp-form signal (D) is phase shifted by a time period equal to the above mentioned pulse width T, and the sampling pulse signal is trapped within the slope portion of the ramp-form signal. The AND gate 16 is provided so that the sampling is not effected by sampling pulses which are outside the slope portion of the ramp-form signal such as shown by the dashed line in FIG. 6E.

During the shift period of the ramp-form signal, resetting of the slope portion of the ramp-form signal is performed by supplying the Q output signal of the MMV to the switch 4. However, this operation is not essential and the resetting of the slope portion of the ramp-form signal can be omitted. In that case, the a high level signal is sampled during the above mentioned shift period. However, this is practically negligible since the phase error signal is derived as an averaged signal.

FIGS. 7A through 7G show signal waveforms in a case where the speed of rotation of the disc is slower than the synchronized speed of ration. In other wards, the frequency of the playback video signal is lower than the reference frequency under this condition.

In this case, the sampling point of the ramp-form signal goes up along the slope of the ramp signal. Under this condition, the polarity of the phase error signal is positive and the comparator 19 produces a high level output signal. Therefore, the switch 21 is closed to short circuit the resistor $R_1$. Therefore, the pulse width T' of the output pulse signal of the MMV 17 in this state, expressed by $R_2 \cdot C \times K$, is reduced as compared with the previous case, and the shift amount of the ramp-form signal (D) is set smaller than the previous case. However, the overall operation of the system is the same as the previous case.

Figure 8:
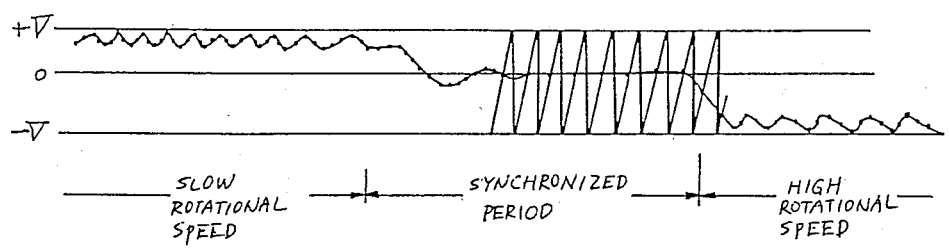

In this way, by detecting a state in which the position of the sampling pulse become outside the slope portions of the ramp-form signal, and triggerring the MMV by the detection signal so as to stop the supply of the reference signal to the dividing counter 13, the phase error signal is stabilized in a negative side when the rotational speed of the disc is slower than the standard synchronized speed as shown in FIG. 8. Similarly, when the speed of the rotation of the disc is higher than the standard sychronized speed, the phase error signal is stabilized in the positive side. Thus, the system operates as the speed detector when the speed of rotation of the disc is outside the range of synchronization. Needless to say, normal positive or negative error signal can be obtained when the speed of rotation of the disc falls within the range of synchronization.

Further, by changing the shift amount of the ramp-form signal depending on whether the speed of rotation is higher or lower than the standard speed as in the case of the preferred embodiment, the sampling pulses can be positioned always on the slope portion of the ramp-form signal.

In the above embodiment, the AND gate 15 which detects the coincidence of the generation timing of the sampling pulse and the output signal of the MMV 2 is utilized as means for detecting the state where the phase of the sampling pulse signal is shifted outside the slope portion of the ramp-form signal. However, the arrangement is not limited to this. For instance, a window comparator can be utilized for comparing the amplitude of the phase error signal, and an output signal obtained when the amplitude of the phase error signal exceeds a predetermined range can be used as a detection signal of the above mentioned state.

In addition, the above embodiment is constructed such that the sampling pulses generated in a period in which the ramp-form signal is shifted is removed by the operation of the AND gate 16. However, this portion of the above embodiment is not essential in embodying the presen invention. The reason of this is described as follows.

In the situation illustrated in FIGS. 6A through 6G, if the sampling pulses under such a condition are not removed, the level of the lowest part of the slope portion is additionally sampled by these sampling signals, and it does not cause any problem. On the other hand, in the situation illustrated in FIGS. 7A through 7G, the level of the lowest part of the slope portion of the ramp-form signal is sampled by this sampling signals and held subsequently as in the case of FIGS. 6A through 6G. However, since the high level part of the slope portion is sampled by other sampling pulses, the sampled signal becomes such that one low level signal because of the shift operation appears in the high level sampled signals appearing succssesively.

However, since the operation of the phase detection system, as the speed detection system, is judged by the overall polarity of the sampled values, that is, a low frequency component of the sampled values, the detection operation is not negatively affected even though the sampling pulses during the shift operation are not removed.

Figure 4:
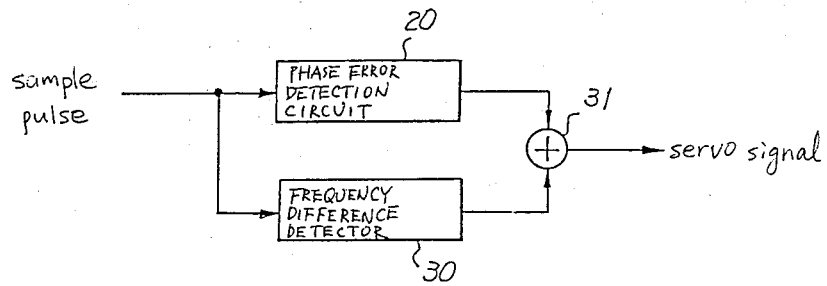
FIG. 4 is a block diagram showing an example of conventional system for generating a rotational speed controlling signal.

It will be appreciatd from the foregoing, that the method and apparatus for comparing the phase according to the present invention is characterized in that a phase comparing function and a frequency detection function are enabled by processing the input signal by means of a single signal processing system. Thus, the detection operation and the circuit construction of the detection circuit are very much simplified as compared with the conventional methods and systems. Further, with the method and apparatus according to the present invention the speed control of the rotary mechanism is performed very much accurately. Moreover, it will be readily appreciated that the problem of the phase deviation during the servo locked operation, which arises from a difference between the stable points (target points) of two independent systems as shown in FIG. 4 is avoided by the method and apparatus according to the present invention.

It is to be noted that the application of the present invention is not limited to the video disc players as exemplary described above. The method and the system according to the present invention are applicable to time base controlling system of recorded information playback apparatuses of various types.

What is claimed is:

1. A method of phase comparison, including a ramp-form signal generating step for generating a ramp-form signal, and sample and hold step for sampling levels of said ramp-form signal with a sampling pulse train signal which is synchronized with a predetermined input signal whose phase change is to be detected and providing a hold level of sampled signals as a phase error signal, wherein said ramp-form signal generating step comprises:

reference frequency signal generating step for generating a reference frequency signal of a predetermined frequency;

dividing step for dividing said reference frequency signal;

detection step for detecting a state in which each pulses of said sampling pulse train signal is generated at a time outside a period of a predetermined section of said ramp-form signal and producing a detection signal;

shift pulse generating step for generating a shift pulse signal having a predetermined pulse width in response to said detection signal; and, gating step for stopping the supply of said reference frequency signal for said dividing step upon presence of said shift pulse signal, and wherein said ramp-form signal is normally generated using an output pulse train signal of said dividing step.

2. A method as set forth in claim 1, wherein said ramp-form signal generating step is adapted to generate said ramp-form signal on the basis of said output pulse train signal and said shift pulse signal when said shift pulse signal is present.

3. A method as set forth in claim 1, wherein said predetermined pulse width is varied depending upon whether a frequency of said predetermined input signal is higher than the frequency of said reference frequency signal or not.

4. A method as set forth in claim 1, wherein said detection step is performed by a window comparator which produces said detection signal when an amplitude of said phase error signal exceeds a predetermined amplitude range.

5. An apparatus of phase comparison, including ramp-form signal generating means for generating a ramp-form signal, and sample and hold means for sampling levels of said ramp-form signal with a sampling pulse train signal which is synchronized with a predetermined input signal whose phase change is to be detected and providing a hold level of sampled signals as a phase error signal, wherein said ramp-form signal generating means comprises:

reference frequency signal generating means for generating a reference frequency signal of a predetermined frequency;

dividing means for dividing said reference frequency signal;

detection means for detecting a state in which each pulses of said sampling pulse train signal is generated at a time outside a period of a predetermined section of said ramp-form signal and producing a detection signal;

shift pulse generating means for generating a shift pulse signal having a predetermined pulse width in response to said detection signal; and, gate means for stopping the supply of said reference frequency signal into said dividing means upon presence of said shift pulse signal, and wherein said ramp-form signal is normally generated using an output pulse train signal of said dividing means.

6. An apparatus as set forth in claim 5, wherein said ramp-form signal generating means generate said ramp-form signal on the basis of said output pulse train signal and said shift pulse signal when said shift pulse signal is present.

7. An apparatus as set forth in claim 5, wherein said predetermined pulse width is varied depending upon whether a frequency of said predetermined input signal is higher than the frequency of said reference frequency signal or not.

8. An apparatus as set forth in claim 5, wherein said detection means is a window comparator which produces said detection signal when an amplitude of said phase error signal exceeds a predetermined amplitude range.

9. A method of phase comparison, including a ramp-form wave signal generating step for generating a ramp-form wave signal having return to initial value periods, and sample and hold step for sampling levels of said ramp-form wave signal with a sampling pulse train signal which is synchronized with a predetermined input signal whose phase change is to be detected and provided a hold level of sampled signals as a phase error signal, wherein said ramp-form wave signal generating step comprises:

reference frequency signal generating step for generating a reference frequency signal of a predetermined frequency;

dividing step for dividing said reference frequency signal;

detection step for detecting a state in which each pulses of said sampling pulse train signal is generated at a time outside a period of predetermined section of said ramp-form wave signal different from said return to initial value periods and producing a detection signal;

shift pulse generating step for generating a shift pulse signal having a predetermined pulse width in response to said detection signal; and, gating step for stopping the supply of said reference frequency signal for said dividing step upon presence of said shift pulse signal, and wherein said ramp-form wave signal is normally generated using an output pulse train signal of said dividing step.

10. A method as set forth in claim 9, wherein said ramp-form wave signal generating step is adapted to generate said ramp-form wave signal on the basis of said output pulse train signal and said shift pulse signal when said shift pulse signal is present.

11. A method as set forth in claim 9, wherein said predetermined pulse width is varied depending upon whether the frequency of said predetermined input signal is higher than the frequency of said ramp-form wave signal or not.

12. A method as set forth in claim 9, wherein said detection step is performed by a window comparator which produces said detection signal when an amplitude of said phase error signal exceeds a predetermined amplitude range.

13. An apparatus of phase comparison, including ramp-form wave signal generating means for generating a ramp-form wave signal having return to initial value periods, and sample and hold means for sampling levels of said ramp-form wave signal with a sampling pulse train signal which is synchronized with a predetermined input signal whose phase change is to be detected and providing a hold level of sampled signals as a phase error signal, wherein said ramp-form wave signal generating means comprises:

reference frequency signal generating means for generating a reference frequency signal of a predetermined frequency;

dividing means for dividing said reference frequency signal;

detection means for detecting a state in which each pulses of said sampling pulse train signal is generated at a time outside a period of a predetermined section of said ramp-form wave signal different from said return to initial value periods and producing a detection signal;

shift pulse generating means for generating a shift pulse signal having a predetermined pulse width in response to said detection signal; and, gate means for stopping the supply of said reference frequency signal into said dividing means upon presence of said shift pulse signal, and wherein said ramp-form wave signal is normally generated using an output pulse train signal of said dividing means.

14. An apparatus as set forth in claim 13, wherein said ramp-form wave signal generating means generate said ramp-form wave signal on the basis of said output pulse train signal and said shift pulse signal when said shift pulse signal is present.

15. An apparatus as set forth in claim 13, wherein said predetermined pulse width is varied depending upon whether the frequency of said predetermined input signal is higher than the frequency of said ramp-form wave signal or not.

16. An apparatus as set forth in claim 13, wherein said detection means is a window comparator which produces said detection signal when an amplitude of said phase error signal exceeds a predetermined amplitude range.

17. A method of phase comparison, including a phase reference signal generating step for generating a phase reference signal, and sample and hold step for sampling levels of said phase reference signal with a sampling pulse train signal which is synchronized with a predetermined input signal whose phase change is to be detected and providing a hold level of sampled signals as a phase error signal, wherein said phase referene signal generating step comprises:

frequency signal generating step for generating a frequency signal of a predetermined frequency;

dividing step for dividing said frequency signal;

detection step for detecting a state in which a phase of said sampling pulse train signal is deviated from a predetermined phase section of said phase reference signal and producing a detection signal;

shift pulse generating step for generating a shift pulse signal having a predetermined pulse width in response to said detection signal; and, gating step for stopping the supply of said frequency signal for said dividing step upon presence of said shift pulse signal, and wherein said phase referene signal is normally generated using an output pulse train signal of said dividing step.

18. A method as set forth in claim 17, wherein said phase reference signal generating step is adapted to generate said phase reference signal on the basis of said output pulse train signal and said shift pulse signal when said shift pulse signal is present.

19. A method as set forth in claim 17, wherein said predetermined pulse width is varied depending upon whether the frequency of said predetermined input signal is higher than the frequency of said phase reference signal or not.

20. An apparatus of phase comparison, including phase reference signal generating means for generating a phase reference signal, and sample and hold means for sampling levels of said phase reference signal with a sampling pulse train signal which is synchronized with a predetermined input signal whoses phase change is to be detected and providing a hold level of sampled signals as a phase error signal, wherein said phase reference signal generating means comprises:

frequency signal generating means for generating a frequency signal of a predetermined frequency;

dividing means for dividing said frequency signal;

detecting means for detecting a state in which a phase of said sampling pulse train signal is deviated from a predetermined phase section of said phase reference signal and producing a detection signal;

shift pulse generating means for generating a shift pulse signal having a predetermined pulse width in response to said detection signal; and, gate means for stopping the supply of said frequency signal into said dividing means upon presence of said shift pulse signal, and wherein said phase reference signal is normally generated using an output pulse train signal of said dividing means.

21. An apparatus as set forth in claim 20, wherein said phase reference signal generating means generate said phase reference signal on the basis of said output pulse train signal and said shift pulse signal when said shift pulse signal is present.

22. An apparatus as set forth in claim 20, wherein said predetermined pulse width is varied depending upon whether the frequency of said predetermined input signal is higher than the frequency of said phase reference signal or not.

* * * * *